United States Patent [19]
Blieden et al.

[11] 4,153,813
[45] May 8, 1979

[54] LUMINESCENT SOLAR COLLECTOR

[75] Inventors: Harry R. Blieden, Los Angeles, Calif.; Richard C. Sill, Reno, Nev.

[73] Assignee: Atlantic Richfield Company, Los Angeles, Calif.

[21] Appl. No.: 916,447

[22] Filed: Jun. 19, 1978

[51] Int. Cl.$^2$ .............................................. H01L 31/04
[52] U.S. Cl. ............................ 136/89 PC; 136/89 HY
[58] Field of Search ................. 136/89 PC, 89 HY; 250/227, 361 R, 458, 483, 487

[56] References Cited

U.S. PATENT DOCUMENTS

| 3,615,853 | 10/1971 | Paine et al. | 136/89 |
|---|---|---|---|
| 3,801,389 | 4/1974 | Fujimura | 156/6 |
| 4,110,123 | 8/1978 | Goetzberger et al. | 136/89 HY |

OTHER PUBLICATIONS

A. Goetzberger et al., "Solar Energy Conversion with Fluorescent Collectors," Appl. Phys., vol. 14, pp. 123-139, (1977).

Primary Examiner—Aaron Weisstuch
Attorney, Agent, or Firm—Roderick W. MacDonald

[57] ABSTRACT

A luminescent solar collector comprising at least one luminescent member having at least one photovoltaic means operably associated therewith, said luminescent member having a side which is to be exposed to incoming (incident) light, and a transparent member carried adjacent to the incident light side of the luminescent member, the outer exposed side of the transparent member having a roughened surface.

4 Claims, 4 Drawing Figures

LUMINESCENT SOLAR COLLECTOR

BACKGROUND OF THE INVENTION

It is known that a photovoltaic semiconductor p-n junction can convert to electricity only that portion of the incident photon energy spectrum, typically solar radiation, which creates hole-electron pairs within a given semiconductor material. For example, in a silicon photovoltaic cell only that portion of the solar spectrum with energy in the vicinity of the 1.1 electron volts per photon band gap is converted into electricity. Photons of lesser energy are not absorbed at all. More energetic photons are strongly absorbed and are wasted in the heating the cell, which heat can degrade the cell's energy conversion efficiency. To maximize the efficiency of a given photovoltaic cell, it is advantageous to convert as much of the available light as possible into an energy range to which such cell can respond in the generation of electricity before the light strikes the cell's surface.

One technique for achieving such a conversion takes advantage of the fact that light falling upon a luminescent agent is characteristically re-radiated or emitted in a narrow band of wavelengths of known energy content. Also, light absorbed by such an agent from one direction is re-emitted in many directions. Such agents include, for example, pigments such as metal oxides and organic dyes which are used in scintillation counters, lasers, and the like. For the purpose of this invention, the term "luminescent agent" includes all types of luminescent agents exhibiting all species of luminescence, including, but not limited to, fluorescence and phosphorescence.

It has been shown that the dispersal of a luminescent agent within an internally reflective sheet of transparent glass or plastic, one of whose major surfaces is exposed to light, concentrates and focuses a flux of light of known energy level toward one or more of the thin upstanding edge faces of the sheet. If a photovoltaic cell responsive to light at that energy level is optically coupled to such edge face, the energy conversion efficiency of the cell increases several times. In this invention a light transmissive member of such construction and properties is termed a "luminescent member" and a photovoltaic solar collector employing such a member is termed a "luminescent solar collector". A luminescent solar collector of this type is fully and completely disclosed in Optics, Vol. 15, No. 10, pages 2299 – 2300, dated October, 1976, the disclosure of which is incorporated herein by reference.

Heretofore the prior art devices have not been highly efficient for the collection of low angle incoming (incident) light.

SUMMARY OF THE INVENTION

According to this invention there is provided a luminescent solar collector which is more efficient for the collection of low angle incident light and which also helps retain internally reflected light notwithstanding contaminants on the incident light side of the collector.

By this invention there is provided a luminescent solar collector having a luminescent member which carries photovoltaic means wherein on the incident light side of the luminescent member there is disposed a transparent member and the side of the transparent member which is exposed to the elements, i.e., the side furthest from the luminescent member has a roughened surface. The roughened surface helps capture low angle incident light from the sun and direct that light into the interior of the luminescent member and moisture or other foreign matter on the roughened surface does not degrade performance. Accordingly, it is an object of this invention to provide a new and improved luminescent solar collector specially adapted to capture low angle incident light for conversion to electricity.

Other aspects, objects and advantages of this invention will be apparent to those skilled in the art from this disclosure and the appended claims.

DETAILED DESCRIPTION OF THE INVENTION

Figure 1:
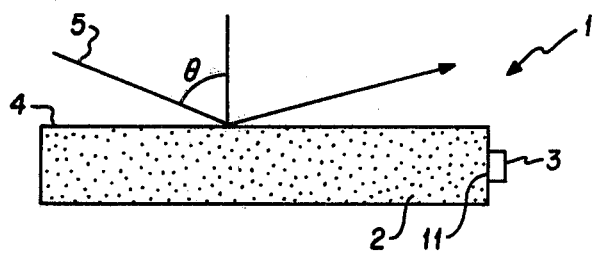
FIG. 1 shows a prior art luminescent collector.

FIG. 1 shows a luminescent solar collector 1 composed of a luminescent member 2 having disposed therein a plurality of particles of one or more luminescent agents and carrying a photovoltaic cell 3 on an upstanding edge face 11 of member 2. Prior art collectors have employed a luminescent member such as member 2 whose side 4, which is the side that is oriented essentially in the direction of the sun for incident light collection, is smooth. Thus, when low angle incident light such as light ray 5 reaches upper smooth surface 4, it is reflected off that surface with a fraction that increases as angle $\theta$ approaches 90° and therefore does not have an opportunity to enter member 2 and ultimately reach photovoltaic cell 3 for the generation of electricity.

Figure 2:
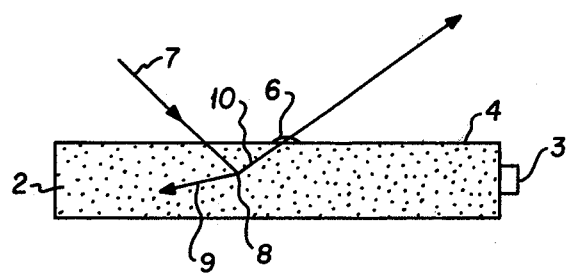
FIG. 2 shows a prior art luminescent collector and its internal reflection problem in relation to external contaminants.

FIG. 2 shows the device of FIG. 1 wherein a water droplet 6, or any other normal type of contaminant which a collector is universally exposed to in operation, is on smooth surface 4. In this situation a light ray 7 which does penetrate to the interior of member 2 and impacts a luminescent agent particle 8 is broken into a plurality of subrays in known manner, only two subrays 9 and 10 being shown for sake of simplicity. If subray 10 hits upper surface 4 in the vicinity of contaminant 6, contaminant 6, because its index of refraction is between that of the matrix material of member 2 and air, helps subray 10 escape from the interior of member 2 back outside the collector. This means subray 10 is lost for the generation of electricity. If contaminant 6 were not on surface 4, subray 10 could be totally internally reflected off surface 4 back into the interior of member 2. By total internal reflection, subrays are kept within the luminescent member and their chance of contact with photovoltaic cell 3 enhanced, thereby increasing the efficiency of the collector for the generation of electricity.

Figure 3:
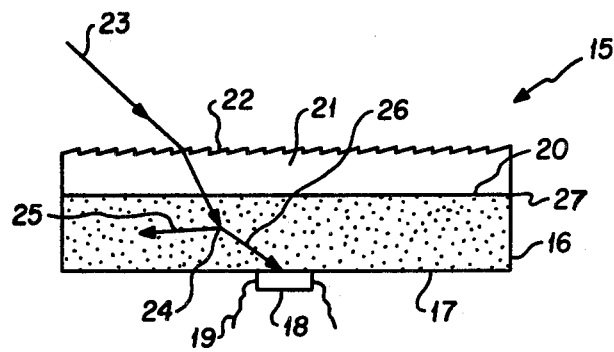
FIG. 3 shows a collector embodiment within this invention.

FIG. 3 shows a collector 15 within this invention which comprises a luminescent member 16 carrying on its large surface area bottom side 17 one or more photovoltaic means 18 which have wires 19 extending therefrom for the removal of electricity. Upper surface 20 of member 16, which is the incident light surface that would correspond to surface 4 of FIGS. 1 and 2, has adjacent thereto a light transparent member 21 whose upper exposed surface, i.e., essentially sun oriented surface 22, is roughened. By using a roughened outer surface 22, low angle incident light rays such as ray 23 will, instead of being reflected in the manner shown in FIG. 1, be directed toward member 16.

When light ray 23 impinges on a luminescent agent particle 24, it will generate a large number of subrays, i.e., be scattered, such as subrays 25 and 26. When a subray such as subray 26 strikes photovoltaic means 18, electricity is generated. Thus, by this invention, low angle incident light is more readily captured and used for the generation of electricity than prior art devices.

There is an interface 27 between the lower side of transparent member 21 and upper side 20 of luminescent member 16. It is desirable, in order to maximize the transmission of light from member 21 to member 16, that interface 27 have essentially no air gaps, since air has a much different index of refraction than the matrix materials of members 21 and 16.

Any material in interface 27 should essentially fill that interface. The material should be fluid enough to fill any air gaps between members 16 and 21, essentially light (optically) transparent, essentially nonabsorbing to light, and have an index of refraction relative to the indices of refraction of members 16 and 21 such that light of wavelengths of interest will readily pass from one member to the other member through the interface material. The interface material can be a viscous fluid used by itself or in conjunction with a solid film which meets the other requirements above. Fluid interface material preferably wets the surface of members 16 and 21 for better filling of voids between the two members. Generally, any material which fits the above requirements can be employed and therefore a very broad range of chemical materials are applicable. For example, low molecular weight fluid polymers can be employed such as polybutenes, e.g., polyisobutylene. These low molecular weight polymers are polymerized not to the solid state but rather to a viscous fluid state like that normally employed in the industry for use in pressure sensitive adhesives. A wide variety of polymeric and other materials can be employed and will be readily apparent to one skilled in the art when apprised of the above functional requirements for the interface material.

Figure 4:
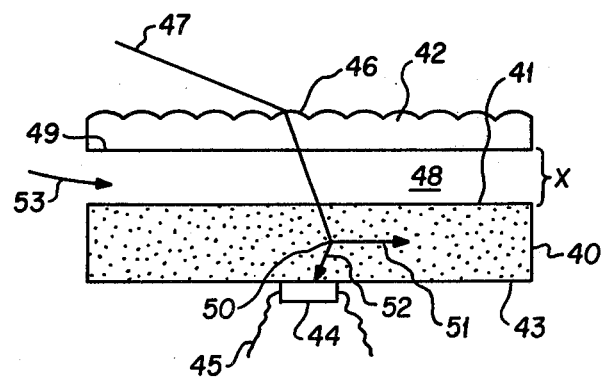
FIG. 4 shows yet another embodiment within this invention.

FIG. 4 shows a collector within this invention wherein a lower luminescent member 40 has adjacent, but not contiguous with (as in FIG. 3), its upper incident light oriented side 41 a transparent member 42, transparent member 42 being spaced apart from upper surface 41 of member 40 a finite distance X. Member 40 carries on its underside 43 at least one photovoltaic means 44 with wires 45 thereon for removal of electricity therefrom. Underside 49 of member 42, like the underside of member 21, is smooth.

Member 42 has an upper incident light oriented surface 46 which is also rough but not in the same manner as surface 22 of member 21. Surface 46 is a more smooth but still uneven surface so that low angle incident light such as ray 47, rather than being reflected off of upper surface 46 like ray 5 of FIG. 1, is captured and passed into member 40 through open space 48. In member 40, ray 47 contacts luminescent agent particle 50 and breaks into a plurality of subrays such as subrays 51 and 52. Subray 51 impinges on photovoltaic cell 44 to generate electricity.

Space 48 can be left open or can have a fluid such as a cooling fluid pass therethrough as shown by arrow 53.

Heat can be recovered from the cooling fluid by conventional heat exchange means not shown so that both heat energy and electricity can be recovered from this embodiment of the invention. It is desirable, although not required, that the cooling fluid meet some or all of the requirements set forth hereinabove with respect to the interface material in interface 26 of FIG. 3.

This invention does not suffer from the same loss of internal light as shown for the prior art device of FIG. 2 because any contaminant on upper surfaces 22 and 46 in FIGS. 3 and 4 would not have the same effect as contaminant 6 of FIG. 2 since the contaminant in FIGS. 3 and 4 would not be in contact with luminescent members 16 and 40. Since upper surfaces 20 and 41 of members 16 and 40, respectively, remain free of external contaminants at all times, upper surfaces 20 and 41 give maximum internal reflection results notwithstanding the extent of contamination of surfaces 22 and 46. In this invention some contamination on surfaces 22 and 46 can make those surfaces more uneven, thereby enhancing the capture of low angle incident light without causing the type of light loss illustrated by FIG. 2.

The light transmitting member matrix material and the luminescent member matrix material can be the same or different but are preferably a polymeric or glass material which is transparent at least to the visible light spectrum. Such matrix material can therefore be of conventional plastic polymeric material such as polymethylmethacrylate, other known acrylic polymers, styrene polymers, and the like. The material can be glass or other transparent material into which luminescent agents can be incorporated and which, like the polymeric material, are nondeleterious to the luminescent agents, the photovoltaic cells, and the like. The matrix material can be any light transmitting material heretofore used in the manufacture of conventional nonluminescent photovoltaic devices. The matrix materials preferable do not contain impurities such as iron and the like which would absorb light rather than allow it to pass on to the photovoltaic cell.

The luminescent agents can include metals or oxides or other compounds of metals such as neodymium oxide employed in a glass matrix or one or more laser dyes such as the coumarin family of dyes and the rhodamine family of dyes. These dyes are quite complex chemically. All of these materials and the characteristics thereof are well known in the art and are commercially available so that further detailed description is unnecessary to inform one skilled in the art.

The luminescent agent or agents are simply dispersed in the matrix material by mixing or other dispersion while the matrix material is in a fluid state due to heating and the like.

Photovoltaic cells are well known in the art and vary widely as to their characteristics and can include, without limitation, silicon, germanium, cadmium sulfide, gallium arsenide, and many other known materials.

Reasonable variations and modifications are possible within the scope of this disclosure without departing from the spirit and scope of this invention.

The embodiments of the invention in which an exclusive property or privilege is claimed are defined as follows:

1. A luminescent solar collector comprising at least one luminescent member having at least one photovoltaic means operably associated therewith, said luminescent member having a side which is to be exposed to incident light, a transparent member carried adjacent said incident light side of said luminescent member, the outer exposed side of said transparent member having a roughened surface.

2. A collector according to claim 1 wherein said luminescent member and said transparent member are spaced from one another.

3. A collector according to claim 1 wherein said luminescent member and said transparent member are essentially contiguous with one another.

4. A collector according to claim 3 wherein there is an interface material between said transparent member and said luminescent member which is essentially transparent and has an index of refraction relative to the indices of refraction of said transparent member and said luminescent member such that light readily passes from one member to the other member through said interface material.

* * * * *